(12) United States Patent
Kim et al.

(10) Patent No.: US 12,718,855 B2
(45) Date of Patent: Aug. 25, 2026

(54) POWER GATING CONTROL CIRCUIT, AND SEMICONDUCTOR APPARATUS AND SEMICONDUCTOR SYSTEM USING THE SAME

(71) Applicant: SK hynix Inc., Icheon-si (KR)

(72) Inventors: Mino Kim, Icheon-si (KR); Sungwoo Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 282 days.

(21) Appl. No.: 18/462,254

(22) Filed: Sep. 6, 2023

(65) Prior Publication Data

US 2024/0312500 A1 Sep. 19, 2024

(30) Foreign Application Priority Data

Mar. 14, 2023 (KR) ........................ 10-2023-0033455

(51) Int. Cl.

| | |
|---|---|
| ***G11C 7/12*** | (2006.01) |
| ***G11C 7/10*** | (2006.01) |
| ***G11C 7/22*** | (2006.01) |
| *G11C 8/10* | (2006.01) |

(52) U.S. Cl.

CPC .................. *G11C 7/12* (2013.01); *G11C 7/10* (2013.01); *G11C 7/222* (2013.01); *G11C 8/10* (2013.01)

(58) Field of Classification Search

CPC ........................................................ G11C 7/12
USPC .......................................................... 365/226
See application file for complete search history.

(56) References Cited

U.S. PATENT DOCUMENTS

| | | | | |
|---|---|---|---|---|
| 8,693,263 | B2 | 4/2014 | Kim | |
| 2004/0158750 | A1* | 8/2004 | Syed | G06F 1/3287 713/320 |
| 2007/0183251 | A1* | 8/2007 | Jang | G11C 7/22 365/233.1 |
| 2018/0040273 | A1* | 2/2018 | Tan | G11C 19/28 |
| 2019/0005866 | A1* | 1/2019 | Li | G09G 3/3266 |
| 2019/0007031 | A1* | 1/2019 | Kwon | H03K 17/08 |
| 2023/0104271 | A1* | 4/2023 | Yoo | G11C 7/222 713/320 |
| 2023/0402123 | A1* | 12/2023 | Park | G11C 29/12005 |

* cited by examiner

*Primary Examiner* — Muna A Techane
(74) *Attorney, Agent, or Firm* — WILLIAM PARK AND ASSOCIATES LTD.

(57) ABSTRACT

A semiconductor apparatus includes a power gating control circuit and a power gating circuit. The power gating control circuit generates a power gating signal based on an idle signal, a clock synchronization signal, and a delayed idle signal. The power gating circuit applies at least a first operating voltage to an internal circuit based on the power gating signal.

8 Claims, 9 Drawing Sheets

Figure 1:
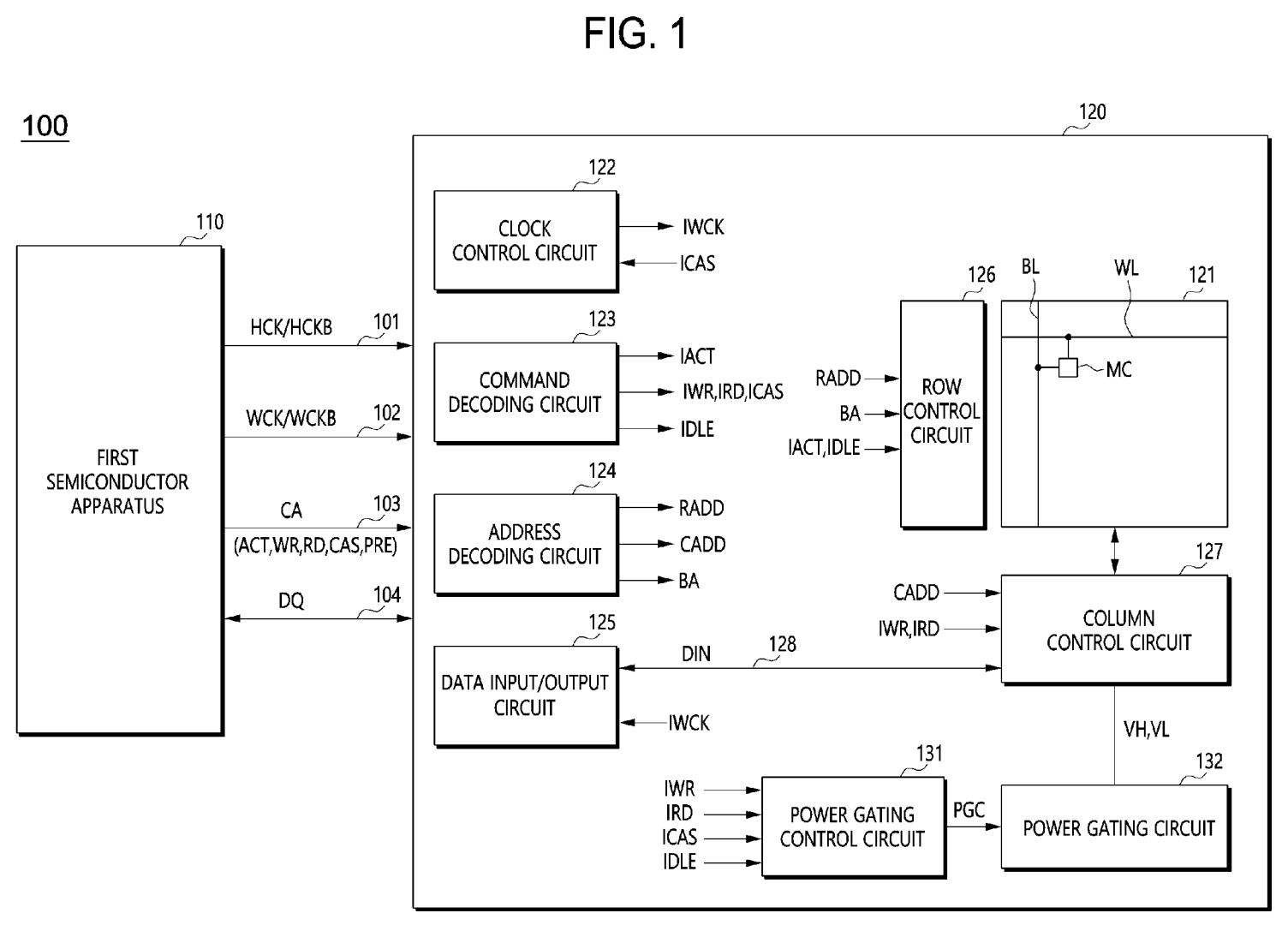

110
FIRST SEMICONDUCTOR APPARATUS

HCK/HCKB 101
WCK/WCKB 102
CA (ACT,WR,RD,CAS,PRE) 103
DQ 104

120

122 CLOCK CONTROL CIRCUIT
IWCK
ICAS

123 COMMAND DECODING CIRCUIT
IACT
IWR,IRD,ICAS
IDLE

124 ADDRESS DECODING CIRCUIT
RADD
CADD
BA

125 DATA INPUT/OUTPUT CIRCUIT
DIN
IWCK
128

126 ROW CONTROL CIRCUIT
RADD
BA
IACT,IDLE

121
WL
BL
MC

127 COLUMN CONTROL CIRCUIT
CADD
IWR,IRD
VH,VL

131 POWER GATING CONTROL CIRCUIT
IWR
IRD
ICAS
IDLE
PGC

132 POWER GATING CIRCUIT

FIG. 2
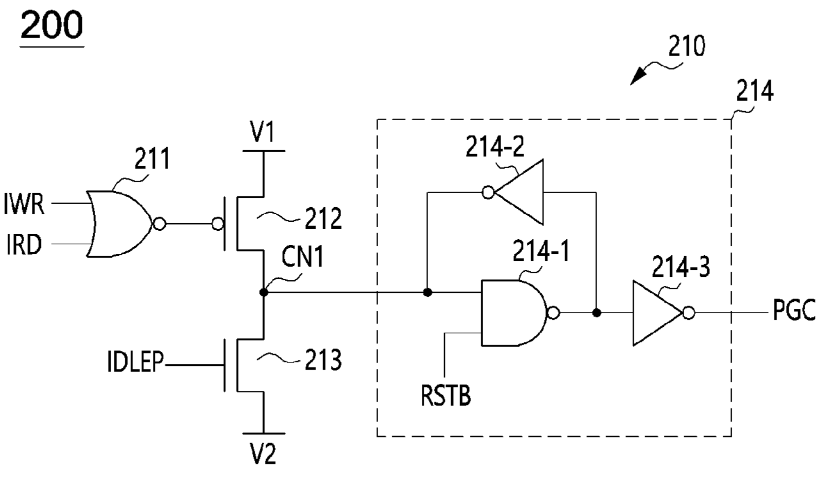
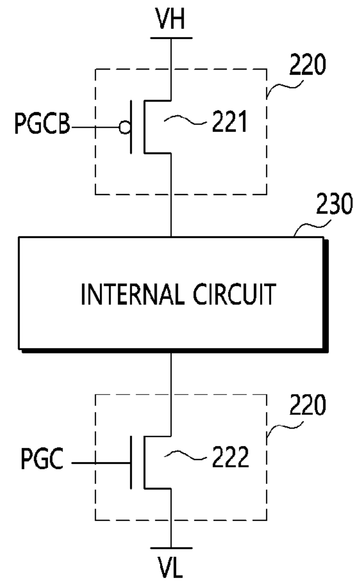

FIG. 4

HCK
CA
CAS
WR OR RD
IDLE
H
IDLEP
L
IWR
PGC

FIG. 5
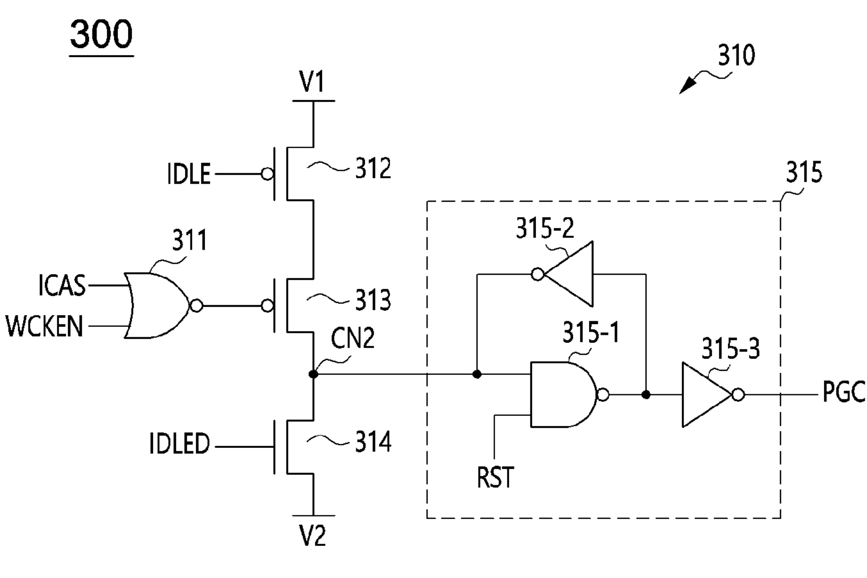
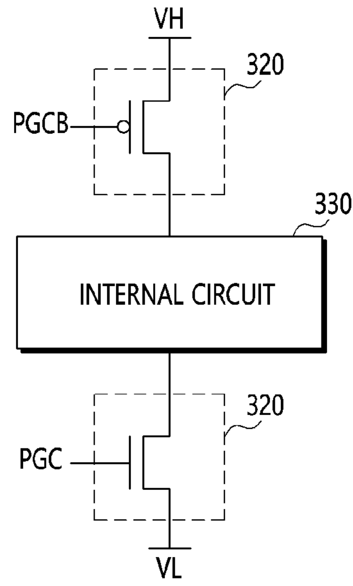

FIG. 6

HCK
CA
ACT
CAS
WR OR RD
PRE
IDLE
IDLEP
ICAS
WCKEN
PGC

FIG. 7

HCK
CA
CAS
WR
IDLE
H
IDLED
H
ICAS
PGC
L

Figure 9:
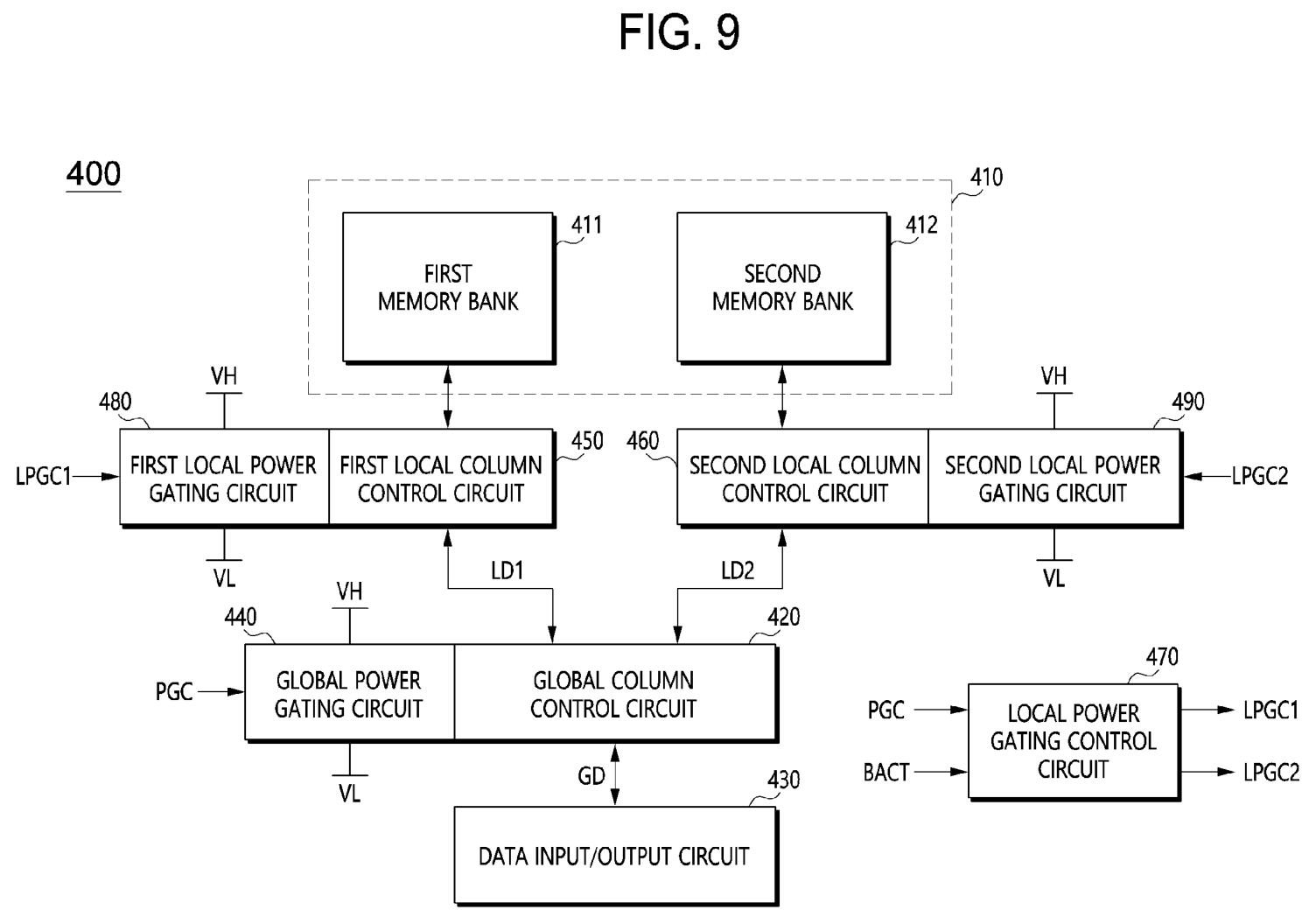

411 FIRST MEMORY BANK

412 SECOND MEMORY BANK

450 FIRST LOCAL COLUMN CONTROL CIRCUIT

460 SECOND LOCAL COLUMN CONTROL CIRCUIT

480 FIRST LOCAL POWER GATING CIRCUIT

490 SECOND LOCAL POWER GATING CIRCUIT

420 GLOBAL COLUMN CONTROL CIRCUIT

440 GLOBAL POWER GATING CIRCUIT

430 DATA INPUT/OUTPUT CIRCUIT

470 LOCAL POWER GATING CONTROL CIRCUIT

LPGC1 LPGC2 VH VL LD1 LD2 GD PGC BACT

POWER GATING CONTROL CIRCUIT, AND SEMICONDUCTOR APPARATUS AND SEMICONDUCTOR SYSTEM USING THE SAME

CROSS-REFERENCES TO RELATED APPLICATION

The present application claims priority under 35 U.S.C. § 119(a) to Korean application number 10-2023-0033455, filed on Mar. 14, 2023, in the Korean Intellectual Property Office, which is incorporated herein by reference in its entirety.

BACKGROUND

1. Technical Field

The present disclosure relates to an integrated circuit technology, and more particularly, to a power gating control circuit, and a semiconductor apparatus and a semiconductor system using the same.

2. Related Art

An electronic device may include many electronic components, and among them, a computer system may include many semiconductor apparatuses each made of semiconductors, a semiconductor "apparatus" being one or more electronic circuits, that are made of an active or passive electronic device, made of a semiconductor material. The semiconductor apparatuses constituting the computer system may each include a processor or a memory controller operating as a master device and a memory apparatus or a storage device operating as a slave device. The master device may provide a command address signal to the slave device, and the slave device may perform various operations based on the command address signal. The master device and the slave device may transmit and receive data to each other.

In order to minimize power consumed by the semiconductor apparatuses, the semiconductor apparatuses may not always supply power to internal circuits, and may cut off power supplied to the internal circuits when the semiconductor apparatuses are in a standby mode or a sleep mode. The ability to selectively cut off the supply of power according to operation modes of the semiconductor apparatuses is called dynamic power gating.

SUMMARY

In an embodiment, a semiconductor apparatus may include a power gating control circuit and a power gating circuit. The power gating control circuit may be configured to enable and output a power gating signal based on a clock synchronization signal and an idle signal, and to disable or "cut off" the power gating signal based on a delayed idle signal generated by delaying the idle signal. The power gating circuit may be configured to apply at least a first operating voltage to an internal circuit based on the power gating signal.

In an embodiment, a semiconductor apparatus may include a power gating control circuit and a power gating circuit. The power gating control circuit may be configured to generate a power gating signal based on a clock synchronization signal and an idle signal, and to prevent the power gating signal from being enabled when the idle signal is in an enabled state. The power gating circuit may be configured to apply at least a first operating voltage to an internal circuit based on the power gating signal.

In an embodiment, a semiconductor apparatus may include a global column control circuit, a global power gating circuit, and a power gating control circuit. The global column control circuit may be configured to perform a data input/output operation between a plurality of memory banks and a data input/output circuit. The global power gating circuit may be configured to apply at least a first operating voltage to the global column control circuit based on a power gating signal. The power gating control circuit may be configured to generate a power gating control signal based on a preliminary command, which is received before one of an active command, a write command, and a read command is received, and an idle signal.

In an embodiment, a semiconductor system may include a first semiconductor apparatus and a second semiconductor apparatus. The first semiconductor apparatus may be configured to provide at least a first row command, a preliminary command, a first column command, a second column command, and a second row command, and to transmit one of the first row command, the first column command, and the second column command after transmitting the preliminary command. The second semiconductor apparatus may be configured to operate based on the first row command, the preliminary command, the first column command, the second column command, and the second row command. The second semiconductor apparatus may include a power gating control circuit and a power gating circuit. The power gating control circuit may be configured to generate a power gating signal based on the first row command, the preliminary command, and the second row command. The power gating circuit may be configured to apply at least a first operating voltage to an internal circuit based on the power gating signal.

BRIEF DESCRIPTION OF THE DRAWINGS

FIG. 1 is a diagram illustrating the configuration of a semiconductor system in accordance with an embodiment.

FIG. 2 is a diagram illustrating a partial configuration of a semiconductor apparatus in accordance with an embodiment.

FIG. 4 is a timing diagram illustrating an operation of the semiconductor system in accordance with an embodiment.

FIG. 5 is a diagram illustrating a partial configuration of a semiconductor apparatus in accordance with an embodiment.

FIG. 6 is a timing diagram illustrating an operation of the semiconductor system in accordance with an embodiment.

FIG. 7 is a timing diagram illustrating an operation of the semiconductor system in accordance with an embodiment.

FIG. 9 is a diagram illustrating a partial configuration of a semiconductor apparatus in accordance with an embodiment.

DETAILED DESCRIPTION

Figure 3:
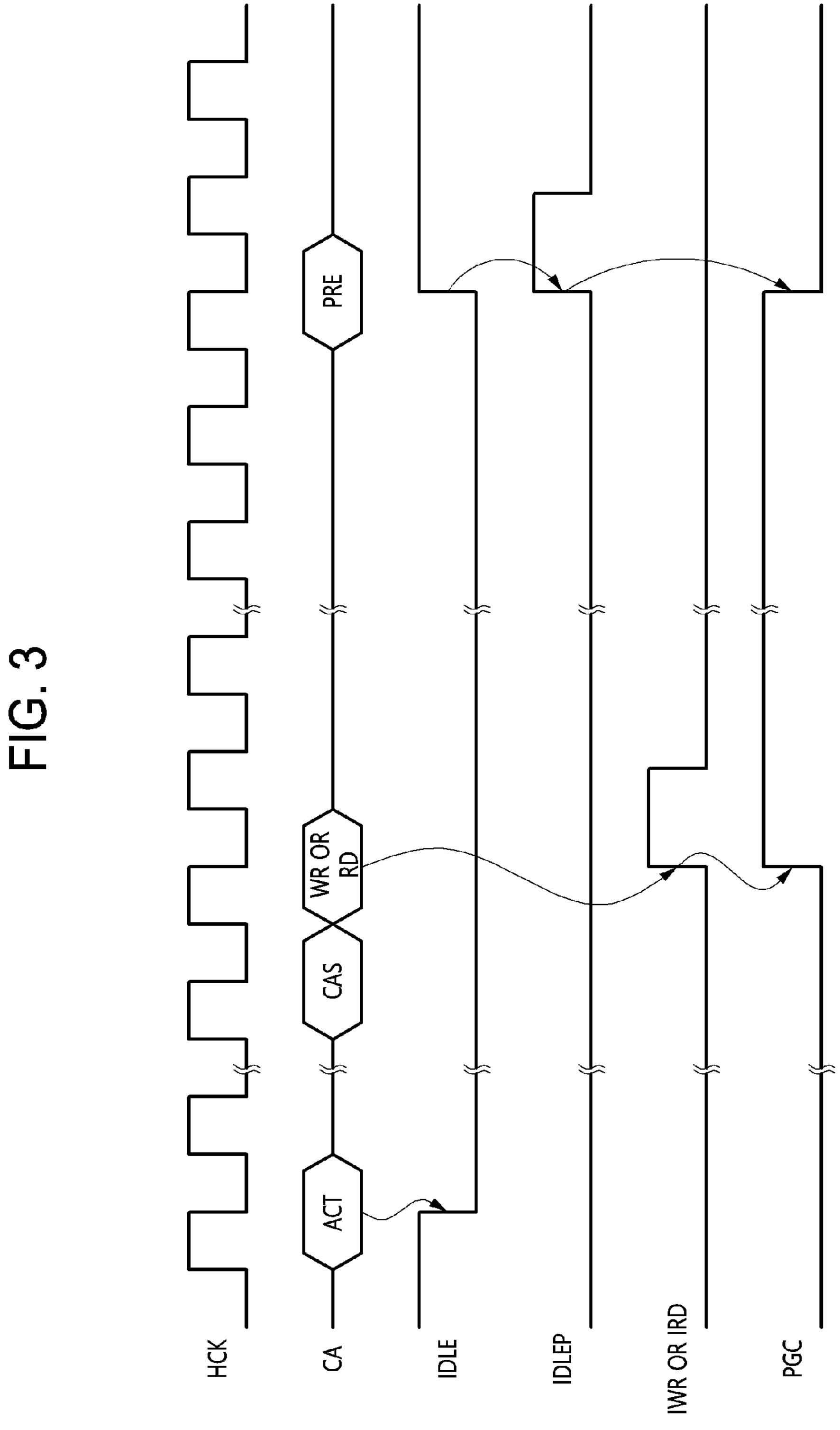
FIG. 3 is a timing diagram illustrating an operation of the semiconductor system in accordance with an embodiment.

FIG. 1 is a diagram illustrating the configuration of a semiconductor system 100 in accordance with an embodiment of the present disclosure. In FIG. 1, the semiconductor system 100 may include a first semiconductor apparatus 110 and a second semiconductor apparatus 120. The first semiconductor apparatus 110 may be a master device for controlling an operation of the second semiconductor apparatus 120. The second semiconductor apparatus 120 may be a slave device capable of performing various operations under the control of the first semiconductor apparatus 110.

The first semiconductor apparatus 110 may provide various control signals necessary for the operation of the second semiconductor apparatus 120. The first semiconductor apparatus 110 may include various types of host devices. For example, the first semiconductor apparatus 110 may include a central processing unit (CPU), a graphics processing unit (GPU), a multi-media processor (MMP), a digital signal processor, an application processor (AP), and a memory controller. The second semiconductor apparatus 120 may be, for example, a memory apparatus, and the memory apparatus may include a volatile memory and a nonvolatile memory. The volatile memory may include a static RAM (SRAM), a dynamic RAM (DRAM), and a synchronous DRAM (SDRAM), and the nonvolatile memory may include a read only memory (ROM), a programmable ROM (PROM), an electrically erasable and programmable ROM (EEPROM), an erasable programmable ROM (EPROM), a flash memory, a phase change RAM (PRAM), a magnetic RAM (MRAM), a resistive RAM (RRAM), a ferroelectric RAM (FRAM), and the like.

As used herein, a bus is two or more electrically parallel conductors in an electronic device or system, which forms a signal transmission path, in or for the electronic device or system. As shown in FIG. 1, the second semiconductor apparatus 120 may be connected to the first semiconductor apparatus 110 through a plurality of buses, which may be signal transmission paths, links, or channels for transmitting signals between the first and second apparatuses.

The plurality of buses may include a first clock bus 101, a second clock bus 102, a command address bus 103, a data bus 104, and the like. The first clock bus 101, the second clock bus 102, and the command address bus 103 may be unidirectional buses from the first semiconductor apparatus 110 to the second semiconductor apparatus 120. The data bus 104 may be a bi-directional bus.

The second semiconductor apparatus 120 may be connected to the first semiconductor apparatus 110 through the first clock bus 101, by which it may receive a system clock signal HCK from the first semiconductor apparatus 110. The system clock signal HCK may be transmitted through the first clock bus 101 as a differential signal together with a complementary signal HCKB.

The second semiconductor apparatus 120 may also be connected to the first semiconductor apparatus 110 through the second clock bus 102, and may receive a data clock signal WCK from the first semiconductor apparatus 110. The data clock signal WCK may be transmitted through the second clock bus 102 as a differential signal together with a complementary signal WCKB.

The data clock signal WCK may have a higher frequency than the system clock signal HCK. The system clock signal HCK may be provided from the first semiconductor apparatus 110 to the second semiconductor apparatus 120 regardless of the type of operation performed by the semiconductor system 100. The data clock signal WCK may be provided from the first semiconductor apparatus 110 to the second semiconductor apparatus 120 when the second semiconductor apparatus 120 performs a data input/output operation. For example, an operation of transmitting data DQ from the first semiconductor apparatus 110 to the second semiconductor apparatus 120 may be a write operation, and an operation of transmitting the data DQ from the first semiconductor apparatus 120 to the first semiconductor apparatus 110 may be a read operation. When the write operation and the read operation are performed, the first semiconductor apparatus 110 may provide the data clock signal WCK to the second semiconductor apparatus 120. When operations other than the write operation and the read operation are performed, the first semiconductor apparatus 110 may not provide the data clock signal WCK to the second semiconductor apparatus 120. In an embodiment, even before the second semiconductor apparatus 120 performs the write operation and the read operation in a fast synchronization mode, the first semiconductor apparatus 110 may provide the data clock signal WCK to the second semiconductor apparatus 120. For example, when an active operation of the second semiconductor apparatus 120 is performed, the first semiconductor apparatus 110 may provide the data clock signal WCK to the second semiconductor apparatus 120.

The second semiconductor apparatus 120 may be connected to the first semiconductor apparatus 110 through the command address bus 103, and may receive a command address signal CA from the first semiconductor apparatus 110. The command address signal CA may include a plurality of signal sets, each set including a plurality of bits. The first semiconductor apparatus 110 may transmit the command address signal CA in synchronization with the system clock signal HCK, and the second semiconductor apparatus 120 may receive the command address signal CA based on the system clock signal HCK.

The command address signal CA may include a command signal (sometimes referred to simply as a command) and an address signal (sometimes referred to simply as an address). The command signal may include information on, or may specify the type of operation to be performed by or with the second semiconductor apparatus 120. The address signal may include address information for accessing a particular memory cell or a particular memory cell array 121 in the second semiconductor apparatus 120. Examples of the command signal may include an active command ACT, a write command WR, a read command RD, a clock synchronization command CAS, and a precharge command PRE.

The active command ACT may be a first row command. The precharge command PRE may be a second row command. The write command WR may be a first column command. The read command RD may be a second column command. The clock synchronization command CAS may be a preliminary command.

The first semiconductor apparatus 120 may transmit the clock synchronization command CAS to the second semiconductor apparatus 120 before transmitting the write command WR and the read command RD. The active command ACT may be a command signal instructing, i.e. causing the second semiconductor apparatus 120 to enter an active mode by performing an active operation. The second semiconductor apparatus 120 may enable a specific word line of the memory cell array 121 in the active mode. The precharge command signal PRE may be a command signal instructing, i.e. causing the second semiconductor apparatus 120 to disable an enabled word line and exit the active mode. The write command WR may be a command signal instructing, i.e. causing the second semiconductor apparatus 120 to perform a write operation. The read command RD may be a command signal instructing, i.e., causing the second semiconductor apparatus 120 to perform a read operation. The clock synchronization command CAS may be a command signal instructing, i.e., causing the second semiconductor apparatus 120 to internally perform an operation of synchronizing a phase of the system clock signal HCK with a phase of the data clock signal WCK when the first semiconductor apparatus 110 provides the data clock signal WCK to the second semiconductor apparatus 120.

The second semiconductor apparatus 120 may be connected to the first semiconductor apparatus 110 through the data bus 104, and may receive the data DQ from the first semiconductor apparatus 110 or transmit the data DQ to the first semiconductor apparatus 110. The first semiconductor apparatus 110 may transmit the data DQ to the second semiconductor apparatus 120 in synchronization with the data clock signal WCK, and the second semiconductor apparatus 120 may transmit the data DQ to the first semiconductor apparatus 110 based on the data clock signal WCK.

The second semiconductor apparatus 120 may include one or more memory cell arrays, only one array being shown and identified by reference numeral 121. The second semiconductor apparatus 120 may also include a clock control circuit 122, a command decoding circuit 123, an address decoding circuit 124, a data input/output circuit 125, a row control circuit 126, and a column control circuit 127. Each memory cell array 121 may include a plurality of memory cells MC, and store different data DQ, in each memory cell of the plurality of memory cells MC, the data DQ stored in a memory cell MC possibly being from the first semiconductor apparatus 110 or internal data DIN, generated inside the second semiconductor apparatus 120.

The memory cell array 121 may include a plurality of word lines WL and a plurality of bit lines BL. The plurality of memory cells MC may be connected to points on word lines WL and bit lines BL, where word lines WL and bit lines BL intersect each other. When a specific word line is selected from the plurality of word lines WL and a specific bit line is selected from the plurality of bit lines BL, a memory cell connected between the selected word line and the selected bit line may be accessed. The memory cell array 121 may include a plurality of memory banks, and the plurality of memory banks may be independently accessed.

As used herein, "buffer" refers to a device in which data are stored temporarily in the course of transmission from one point to another. A buffer may compensate for a difference in the flow of data, or time of occurrence of events, when transmitting data from one device to another.

The clock control circuit 122 may be connected to the first and second clock buses 101 and 102 and thus receive the system clock signal HCK and the data clock signal WCK. The clock control circuit 122 may buffer the system clock signal HCK, and provide the buffered system clock signal HCK to the command decoding circuit 123 and the address decoding circuit 124. The clock control circuit 122 may buffer the data clock signal WCK, and provide the buffered data clock signal WCK to the data input/output circuit 125.

The clock control circuit 122 may receive a clock synchronization signal ICAS, and synchronize phases of the system clock signal HCK and the data clock signal WCK with each other based on the clock synchronization signal ICAS. The clock synchronization signal ICAS may be a signal generated from the clock synchronization command CAS of the command address signal CA. The clock control circuit 122 may generate an internal clock signal IWCK by synchronizing a phase of the buffered data clock signal WCK with the system clock signal HCK, and provide the internal clock signal IWCK to the data input/output circuit 125.

The command decoding circuit 123 may be connected to the command address bus 103, and may receive the command address signal CA through the command address bus 103. The command decoding circuit 123 may receive the command address signal in synchronization with the system clock signal HCK buffered by the clock control circuit 122. The command decoding circuit 123 may generate a plurality of internal command signals by decoding the command signal of the command address signal CA. The plurality of internal command signals may include an active signal IACT, an idle signal IDLE, a write signal IWR, a read signal IRD, and the clock synchronization signal ICAS.

When the command address signal CA includes the active command ACT, the command decoding circuit 123 may generate the active signal IACT by decoding the command address signal CA. When the command address signal CA includes the precharge command PRE, the command decoding circuit 123 may generate the idle signal IDLE by decoding the command address signal CA. When the command address signal CA includes the write command WR, the command decoding circuit 123 may generate the write signal IWR by decoding the command address signal CA. When the command address signal CA includes the read command RD, the command decoding circuit 123 may generate the read signal IRD by decoding the command address signal CA. When the command address signal CA includes the clock synchronization command CAS, the command decoding circuit 123 may generate the clock synchronization signal ICAS by decoding the command address signal CA.

The address decoding circuit 124 may be connected to the command address bus 103, and may receive the command address signal CA through the command address bus 103. The address decoding circuit 124 may receive the command address signal CA in synchronization with the system clock signal HCK buffered by the clock control circuit 122. The address decoding circuit 124 may generate an internal address signal by decoding the address signal of the command address signal CA. The internal address signal may include a row address signal RADD, a column address signal CADD, and a bank address signal BA. The address decoding circuit 124 may generate the row address signal RADD and the bank address signal BA based on an address signal received together with a row command signal.

For example, the address decoding circuit 124 may generate the row address signal RADD and the bank address signal BA by decoding an address signal received together with the active command ACT. The address decoding circuit 124 may generate the column address signal CADD based on an address signal received together with a column command signal. For example, the address decoding circuit 124 may generate the column address signal CADD by decoding an address signal received together with the write command WR and the read command RD.

The data input/output circuit 125 may be connected to the data bus 104, and may receive the data DQ received from the first semiconductor apparatus 110 through the data bus 104 or transmit the data DQ to the first semiconductor apparatus 110. In the write operation, the data input/output circuit 125 may receive the data DQ from the first semiconductor apparatus 110, and generate different internal data DIN of the second semiconductor apparatus 120 from the externally-provided data DQ. In the read operation, the data input/output circuit 105 may generate the data DQ from the internal data DIN of the second semiconductor apparatus 120, and transmit the data DQ generated from internal data DIN to the first semiconductor apparatus 110.

The internal data DIN of the second semiconductor apparatus 120 may be transmitted between the data input/output circuit 125 and the memory cell array 121 through a global data bus 128. The data input/output circuit 125 may receive the internal clock signal IWCK from the clock control circuit 122. The data input/output circuit 105 may receive the data DQ based on the internal clock signal IWCK, and transmit the data DQ based on the internal clock signal IWCK. The data input/output circuit 105 may include a serializer-deserializer (SerDes) that generates the internal data DIN by parallelizing the data DQ transmitted through the data bus 104, and generates the data DQ by serializing the internal data DIN.

The row control circuit 126 may receive the active signal IACT and the idle signal IDLE from the command decoding circuit 123, and receive the bank address signal BA and the row address signal RADD from the address decoding circuit 124. The row control circuit 126 may select a specific memory bank from the plurality of memory banks of the memory cell array 121 based on the bank address signal BA when the active signal IACT is enabled, and enable a specific word line based on the row address signal RADD. When the idle signal IDLE is enabled, the row control circuit 126 may release the selected memory bank and disable the enabled word line.

The column control circuit 127 may receive the write signal IWR and the read signal IRD from the command decoding circuit 123, and receive the column address signal CADD from the address decoding circuit. The column control circuit 127 may connect the data input/output circuit 125 and the memory cell array 121. The column control circuit 127 may be connected to the data input/output circuit 125 through the global data bus 128. The column control circuit 127 may select a bit line of the memory cell array 121 based on the column address signal CADD, and may be connected to the selected bit line. The column control circuit 127 may receive the internal data DIN transmitted through the global data bus 128 based on the write signal IWR, and write the internal data DIN to a memory cell connected to the selected bit line. The column control circuit 127 may read data stored in the memory cell connected to the selected bit line based on the read signal IRD, generate the internal data DIN based on the read data, and transmit the internal data DIN to the data input/output circuit 125.

The second semiconductor apparatus 120 may further include a power gating control circuit 131 and a power gating circuit 132. The power gating control circuit 131 may generate a power gating signal PGC based on at least a part of one or more internal command signals.

The power gating control circuit 131 may determine whether the column control circuit 127 is used in an operation performed by the second semiconductor apparatus 120, based on the plurality of internal command signals, and selectively enable the power gating signal PGC according to the determination result. The power gating control circuit 131 may enable the power gating signal PGC when the column control circuit 127 is used, and disable the power gating signal PGC when the column control circuit 127 is not used. The power gating control circuit 131 may generate the power gating signal PGC based on at least a part of the internal write signal IWR, the internal read signal IRD, the clock synchronization signal ICAS, and the idle signal IDLE.

The power gating circuit 132 may receive the power gating signal PGC. The power gating circuit 132 may selectively provide at least a first operating voltage VH to the column control circuit 127 based on the power gating signal PGC. The power gating circuit 132 may apply the first operating voltage VH to the column control circuit 127 when the power gating signal PGC is enabled. The power gating circuit 132 may not apply the first operating voltage VH to the column control circuit 127 when the power gating signal PGC is disabled. When the application of the first operating voltage VH to the column control circuit 127 is discontinued or blocked, the column control circuit 127 may be deactivated and power consumption of the second semiconductor apparatus 120 may be reduced. The power gating circuit 132 may further provide a second operating voltage VL to the column control circuit 127 based on the power gating signal PGC. The second operating voltage VL may have a lower voltage level than the first operating voltage VH. When the power gating signal PGC is enabled, the power gating circuit 132 may apply the second operating voltage VL to the column control circuit 127, and when the power gating signal PGC is disabled, the power gating circuit 132 may not apply the second operating voltage VL to the column control circuit 127.

FIG. 2 is a diagram illustrating a semiconductor apparatus 200 in accordance with an embodiment of the present disclosure. The semiconductor apparatus 200 may be a component part of the second semiconductor apparatus 120 of FIG. 1.

Referring now to FIG. 2, the semiconductor apparatus 200 may include a power gating control circuit 210 depicted in the upper half or portion of FIG. 2, and a power gating circuit 220, and an internal circuit 230, which are depicted in the lower half or portion of FIG. 2.

The power gating control circuit 210 may receive an idle pulse signal IDLEP and at least one of a write signal IWR and a read signal IRD, and generate a power gating signal PGC. The power gating control circuit 210 may enable or disable (output or not output) the power gating signal PGC based on, i.e., as a response to, the idle pulse signal IDLEP and at least one of the write signal IWR and the read signal IRD.

Referring now to FIG. 1 and FIG. 2, the write signal IWR may be an internal command signal generated from the write command WR. The read signal IRD may be an internal command signal generated from the read command RD. The idle pulse signal IDLEP may be a pulse signal generated in synchronization with the idle signal IDLE.

For example, the idle pulse signal IDLEP may be a pulse signal generated synchronously or asynchronously with the idle signal when the idle signal IDLE is enabled. The power gating control circuit 210 may enable the power gating signal PGC when at least one of the write signal IWR and the read signal IRD is enabled. The power gating control circuit 210 may disable the power gating signal PGC when the idle pulse signal IDLEP is enabled.

The power gating control circuit 210 may further receive a reset signal RSTB. When the reset signal RSTB is received, the power gating control circuit 210 may disable the power gating signal PGC regardless of the write signal IWR and the read signal IRD. The PGC signal output from the power gating control circuit 210 depicted in FIG. 2, may be the same PGC signal output from the power gating control circuit 131 depicted in FIG. 1.

As shown in the upper half of FIG. 2, the power gating control circuit 210 may include a NOR gate 211, a first transistor 212 connected in series to a second transistor 213, and a latch driver 214 having an input, the input of which is connected to the node CN1 between the series-connected transistors, 212, 213. The NOR gate 211 may receive the write signal IWR and the read signal IRD, and generate an output signal having a low logic level when at least one of the write signal IWR and the read signal IRD is a high logic level. The NOR gate 211 may generate an output signal having a logic one, i.e., a high logic level, when both the write signal IWR and the read signal IRD are at a logic zero level or "disabled". In other words, the output of NOR gate 211 is logic one when both inputs IWR and IRD are logic zero. Actual voltages of a logic one and a logic zero are of course a design choice.

The first transistor 212 may be a P-channel MOS transistor. The gate of the first transistor 212 may receive the output signal of the XOR gate 211. The source of the first transistor 212 may receive a first voltage V1. The drain of the first transistor 212 may be connected to the common node CN1.

The second transistor 213 may be an N-channel MOS transistor. The gate of the second transistor 213 may receive the idle pulse signal IDLEP. The drain of the second transistor 213 may be connected to the common node CN1. The source of the second transistor 213 may receive a second voltage V2.

The second voltage V2 may have a lower voltage level than the first voltage V1. The first voltage V1 may have a voltage level high enough to be able to raise the voltage of common node CN1 to a high logic level. The second voltage V2 may have a voltage level low enough to set the common node CN1 to a low logic level. The latch driver 214 may receive a signal through the common node CN1 and generate the power gating signal PGC. The latch driver 214 may latch the voltage level of the common node CN1, and generate the power gating signal PGC having a voltage level corresponding to the voltage level of the common node CN1. When the voltage level of the common node CN1 rises to a high logic level, the latch driver 214 may enable the power gating signal PGC to a high logic level. When the voltage level of the common node CN1 drops to a low logic level, the latch driver 214 may disable the power gating signal PGC to a low logic level. The latch driver 214 may further receive the reset signal RSTB. The latch driver 214 may disable the power gating signal PGC when the reset signal RSTB is enabled. For example, when the reset signal RSTB is enabled to a low logic level, the latch driver 214 may disable the power gating signal PGC. The latch driver 214 may include a NAND gate 214-1, a first inverter 214-2, and a second inverter 214-3. A first input terminal of the NAND gate 214-1 may be connected to the common node CN1, and a second input terminal of the NAND gate 214-1 may receive the reset signal RSTB. An input terminal of the first inverter 214-2 may be connected to an output terminal of the NAND gate 214-1, and an output terminal of the first inverter 214-2 may be connected to the common node CN1. An input terminal of the second inverter 214-3 may be connected to an output terminal of the NAND gate 214-1, and the power gating signal PGC may be output from an output terminal of the second inverter 214-3.

The power gating circuit 220 may receive the power gating signal PGC from the power gating control circuit 210. The power gating circuit 220 may receive at least a first operating voltage VH. The power gating circuit 220 may be connected to the internal circuit 230, and selectively provide the first operating voltage VH to the internal circuit 230 based on the power gating signal PGC. For example, when the power gating signal PGC is enabled, the power gating circuit 220 may apply the first operating voltage VH to the internal circuit 230. When the power gating signal PGC is disabled, the power gating circuit 220 may block the application of the first operating voltage VH or might not provide the first operating voltage VH to the internal circuit. The power gating circuit 220 may further receive a second operating voltage VL, and selectively provide the second operating voltage VL to the internal circuit 230 based on the power gating signal PGC. For example, when the power gating signal PGC is enabled, the power gating circuit 220 may apply the second operating voltage VL to the internal circuit 230. When the power gating signal PGC is disabled, the power gating circuit 220 may block or might not provide the application of the second operating voltage VL to the internal circuit 230. The power gating circuit 220 may be applied as the power gating circuit 132 of FIG. 1. In one embodiment, the first voltage V1 may have a voltage level equal to or different from that of the first operating voltage VH. The second voltage V2 may have a voltage level equal to or different from that of the second operating voltage VL.

The power gating circuit 220 may include a third transistor 221 and a fourth transistor 222. The third transistor 221 may be a P-channel MOS transistor. A gate of the third transistor 221 may receive a complementary signal PGCB of the power gating signal PGC, a source of the third transistor 221 may receive the first operating voltage VH, and a drain of the third transistor 221 may be connected to the internal circuit 230. When the complementary signal PGCB of the power gating signal PGC has a low logic level, the third transistor 221 may apply the first operating voltage VH to the internal circuit 230. When the complementary signal PGCB of the power gating signal PGC has a high logic level, the third transistor 221 may not apply the first operating voltage VH to the internal circuit 230. The fourth transistor 222 may be an N-channel MOS transistor. A gate of the fourth transistor 222 may receive the power gating signal PGC, a drain of the fourth transistor 222 may be connected to the internal circuit 230, and a source of the fourth transistor 222 may receive the second operating voltage VL. When the power gating signal PGC has a high logic level, the fourth transistor 222 may apply the second operating voltage VL to the internal circuit 230. When the power gating signal PGC has a low logic level, the fourth transistor 222 may not apply the second operating voltage VL to the internal circuit 230.

The internal circuit 230 may operate by receiving the first and second operating voltages VH and VL. The internal circuit 230 may include any logic circuit included in the semiconductor apparatus 200. For example, the internal circuit 230 may be the column control circuit 127 of FIG. 1. When the first and second operating voltages VH and VL are applied from the power gating circuit 220, the internal circuit 230 may be activated and may perform a predetermined operation. When even at least one of the first and second operating voltages VH and VL is not applied from the power gating circuit 220, the internal circuit 230 may be deactivated and may not perform the predetermined operation.

FIG. 3 is a timing diagram illustrating an operation of the semiconductor system 100 in accordance with an embodiment of the present disclosure. The operation of the semiconductor system 100 in accordance with an embodiment of the present disclosure will be described with reference to FIGS. 1 to 3.

Before the second semiconductor apparatus 120 enters an active mode, the idle signal IDLE may be a high logic level, and the idle pulse signal IDLEP and the power gating control signal PGC at a low logic level. When the command address signal CA including the active command ACT is transmitted from the first semiconductor apparatus 110 to the second semiconductor apparatus 120, in synchronization with the system clock signal HCK, the command decoding circuit 123 may enable the active signal IACT and the second semiconductor apparatus 120 may enter an active mode by performing an active operation.

When the active signal IACT is a high logic level, the idle signal IDLE may be a low logic level. The first semiconductor apparatus 110 may transmit the command address signal CA including the preliminary command and the command address signal CA including the column command to the second semiconductor apparatus 120 so that the second semiconductor apparatus 120 may perform a write operation or a read operation. The first semiconductor apparatus 110 may transmit the clock synchronization command CAS in synchronization with the system clock signal HCK, and then transmit the write command WR or the read command RD. The command decoding circuit 123 may enable the clock synchronization signal ICAS based on the clock synchronization command CAS, and enable the write signal WR or the read signal IRD based on the write command WR or the read command RD.

When the write signal IWR and the read signal IRD are enabled, the first transistor 222 of the power gating control circuit 210 may enable the power gating signal PGC to a high logic level by applying the first voltage V1 to the common node CN1. When the power gating signal PGC is enabled to the high logic level, the power gating circuit 220 may apply the first and second operating voltages VH and VL to the internal circuit 230. The internal circuit 230 may be activated by receiving the first and second operating voltages VH and VL and may perform a predetermined operation. Subsequently, the first semiconductor apparatus 110 may transmit the precharge command PRE to the second semiconductor apparatus 120. The command decoding circuit 123 may enable the idle signal IDLE based on the precharge command PRE.

When the idle signal IDLE is enabled, the idle pulse signal IDLEP may be generated. The power gating control circuit 210 may disable the power gating signal PGC based on the idle pulse signal IDLEP. When the power gating signal PGC is disabled, the power gating circuit 220 may not apply the first and second operating voltages VH and VL to the internal circuit 230, and the internal circuit 230 may be deactivated and may not consume power.

Figure 4:
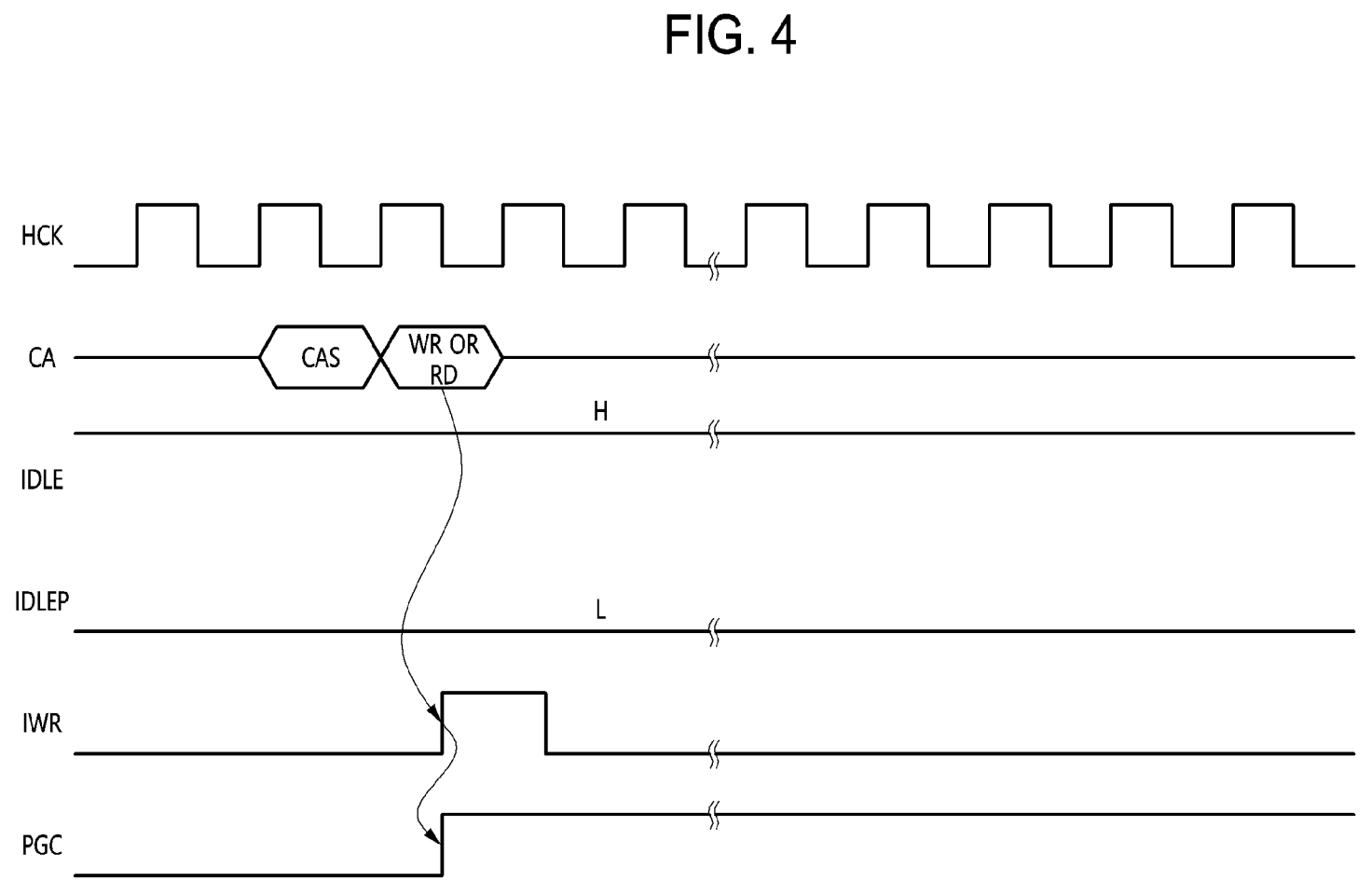

FIG. 4 is a timing diagram illustrating an operation of the semiconductor system 100 in accordance with an embodiment of the present disclosure. The second semiconductor apparatus 120 may perform various operations even without entering an active mode. For example, the second semiconductor apparatus 120 may perform various operations in addition to a write operation, a read operation, and a refresh operation performed using the memory cell array 121. For example, the second semiconductor apparatus 120 may perform a training operation together with the first semiconductor apparatus 110.

During the training operation, internal circuits operating in connection with the memory cell array 121 need not to be activated. For example, the column control circuit 127 may not be activated. The first semiconductor apparatus 110 may transmit the clock synchronization command CAS and the write command WR or the read command RD in order to perform the training operation of the second semiconductor apparatus 120. Since the first semiconductor apparatus 110 does not provide the active command ACT, the idle signal IDLE may remain enabled to a high logic level and the idle pulse signal IDLEP may maintain a low logic level. When the write signal IWR or the read signal IRD is enabled based on the write command WR or the read command RD, the power gating control circuit 210 may enable the power gating signal PGC. The power gating circuit 220 may activate the internal circuit 230 by applying the first and second operating voltages VH and VL to the internal circuit 230 based on the power gating signal PGC.

FIG. 5 is a diagram illustrating a partial configuration of a semiconductor apparatus 300 in accordance with an embodiment of the present disclosure. The semiconductor apparatus 300 may be applied as the second semiconductor apparatus 120 of FIG. 1.

Referring to FIG. 5, the semiconductor apparatus 300 may include a power gating control circuit 310, a power gating circuit 320, and an internal circuit 330. The power gating circuit 320 and the internal circuit 330 are substantially the same components as the power gating circuit 220 and the internal circuit 230 illustrated in FIG. 2, and redundant descriptions of the same components will be omitted. The power gating control circuit 310 may be applied as the power gating control circuit 131 of FIG. 1 and may replace the power gating control circuit 210 of FIG. 2. The power gating control circuit 310 may receive an idle signal IDLE, a clock synchronization signal ICAS, and a delay idle signal IDLED, and generate the power gating signal PGC. The delayed idle signal IDLED may be a signal generated by delaying the idle signal IDLE. For example, the delayed idle signal IDLED may be generated by delaying the idle signal IDLE by a time shorter than one cycle of the system clock signal HCK. When the idle signal IDLE is enabled, the delayed idle signal IDLED may be enabled after a delay time shorter than one cycle of the system clock signal HCK.

In an embodiment, the delayed idle signal IDLED may be generated by delaying only a rising edge of the idle signal IDLE. For example, when the idle signal IDLE transitions from a low logic level to a high logic level, the delayed idle signal IDLED may transition from a low logic level to a high logic level after a delay time shorter than one cycle of the system clock signal HCK. When the idle signal IDLE transitions from a high logic level to a low logic level, the delayed idle signal IDLED may transition from a high logic level to a low logic level at the same time point as the idle signal IDLE transitions.

When the idle signal IDLE is enabled, the power gating control circuit 310 may prevent the power gating signal PGC from being enabled. When the idle signal IDLE is disabled and the clock synchronization signal ICAS is enabled, the power gating control circuit 310 may enable the power gating signal PGC. When the delayed idle signal IDLED is enabled, the power gating control circuit 310 may disable the power gating signal PGC. The power gating control circuit 310 may further receive a reset signal RSTB. When the reset signal RSTB is enabled, the power gating control circuit 310 may disable the power gating signal PGC regardless of the clock synchronization signal ICAS. The power gating signal 310 may further receive a synchronization completion signal WCKEN. The synchronization completion signal WCKEN may be generated from the clock control circuit 122 of FIG. 1. The clock control circuit 122 may enable the synchronization completion signal WCKEN when the phases of the system clock signal HCK and the data clock signal WCK are synchronized based on the clock synchronization signal ICAS. When the idle signal IDLE is disabled and at least one of the clock synchronization signal ICAS and the synchronization completion signal WCKEN is enabled, the power gating control circuit 310 may enable the power gating control signal PGC.

The power gating control circuit 310 may include a logic gate 311, a first transistor 312, a second transistor 313, a third transistor 314, and a latch driver 315. The logic gate 311 may receive the clock synchronization signal ICAS and the synchronization completion signal WCKEN, and generate an output signal having a low logic level when at least one of the clock synchronization signal ICAS and the synchronization completion signal WCKEN is enabled to a high logic level. When both the clock synchronization signal ICAS and the synchronization completion signal WCKEN are in a disabled state, the logic gate 311 may generate an output signal having a high logic level. For example, the logic gate 311 may be a NOR gate. The first transistor 312 may be a P-channel MOS transistor. A gate of the first transistor 312 may receive the idle signal IDLE, and a source of the first transistor 312 may receive the first voltage V1. The second transistor 313 may be a P-channel MOS transistor. A gate of the second transistor 313 may receive the output signal of the logic gate 311, a source of the second transistor 313 may be connected to a drain of the first transistor 312, and a drain of the second transistor 313 may be connected to a common node CN2. The third transistor 314 may be an N-channel MOS transistor. A gate of the third transistor 314 may receive the delay idle signal IDLED, a drain of the third transistor 314 may be connected to the common node CN2, and a source of the third transistor 314 may receive the second voltage V2.

The latch driver 315 may receive a signal through the common node CN2 and generate the power gating signal PGC. The latch driver 315 may latch a voltage level of the common node CN2, and generate the power gating signal PGC having a voltage level corresponding to the voltage level of the common node CN2. When the voltage level of the common node CN2 rises to a high logic level, the latch driver 315 may enable the power gating signal PGC to a high logic level. When the voltage level of the common node CN2 drops to a low logic level, the latch driver 315 may disable the power gating signal PGC to a low logic level. The latch driver 315 may further receive the reset signal RSTB. When the reset signal RSTB is enabled, the latch driver 315 may disable the power gating signal PGC. For example, when the reset signal RSTB is enabled to a low logic level, the latch driver 315 may disable the power gating signal PGC. The latch driver 315 may include a NAND gate 315-1, a first inverter 315-2, and a second inverter 315-3. A first input terminal of the NAND gate 315-1 may be connected to the common node CN2, and a second input terminal of the NAND gate 315-1 may receive the reset signal RSTB. An input terminal of the first inverter 315-2 may be connected to an output terminal of the NAND gate 315-1, and an output terminal of the first inverter 315-2 may be connected to the common node CN2. An input terminal of the second inverter 315-3 may be connected to the output terminal of the NAND gate 315-1, and the power gating signal PGC may be output from an output terminal of the second inverter 315-3.

Figure 6:
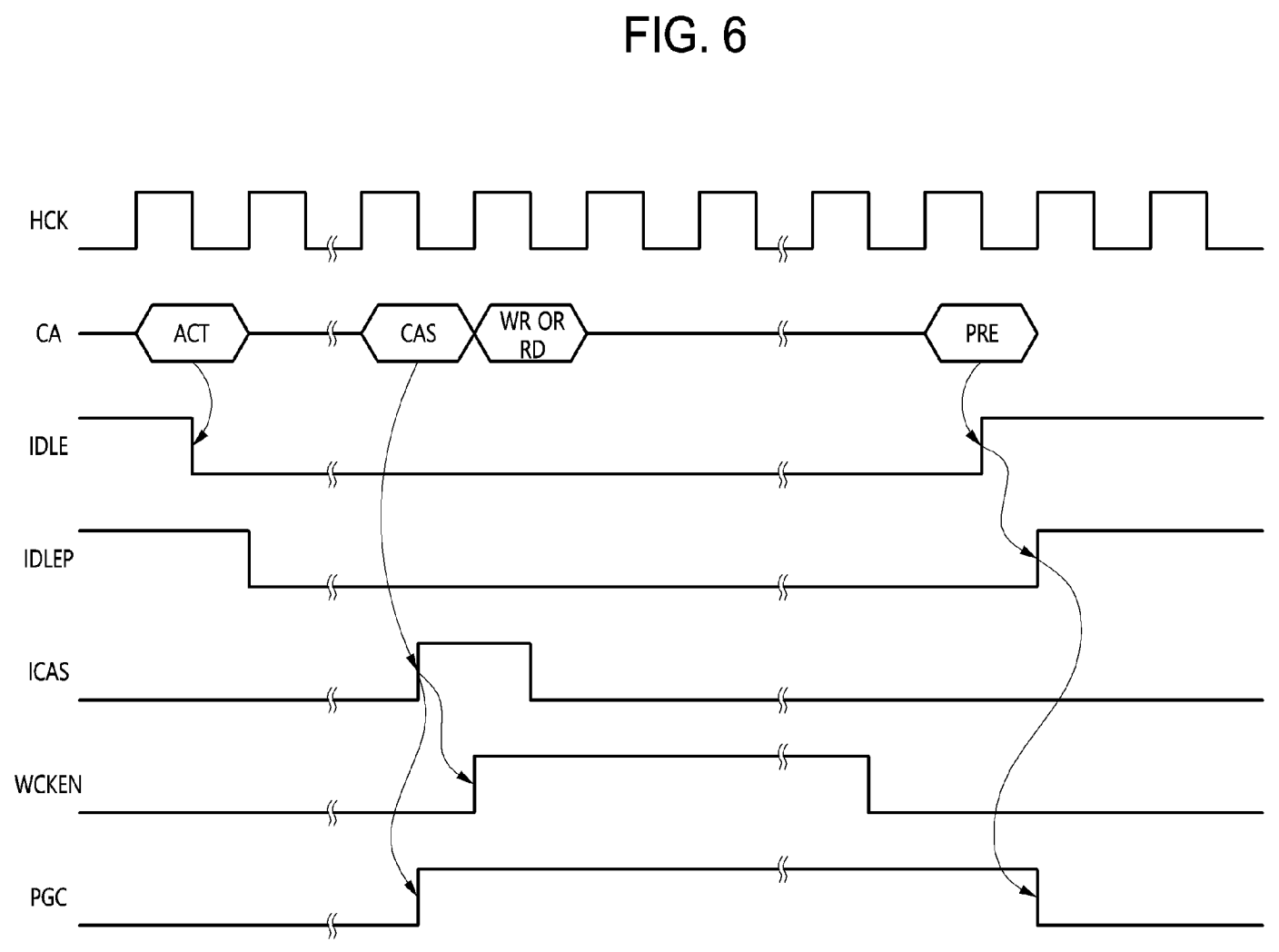

FIG. 6 is a timing diagram 600 illustrating an operation of the semiconductor system 100 in accordance with an embodiment of the present disclosure. The operation of the semiconductor system 100 in accordance with an embodiment of the present disclosure will be described below with reference to FIGS. 1, 5, and 6.

Before the second semiconductor apparatus 120 enters the active mode, the idle signal IDLE and the delayed idle signal IDLED are a high logic level, and the power gating control signal PGC is a low logic level. When a command address signal CA including the active command ACT is transmitted from the first semiconductor apparatus 110 to the second semiconductor apparatus 120 in synchronization with the system clock signal HCK, the command decoding circuit 123 may enable the active signal IACT, i.e., output the IACT signal at high logic lever, whereby the second semiconductor apparatus 120 may enter an active mode by performing an active operation.

When the active signal IACT is enabled, the idle signal IDLE may be disabled, and the delayed idle signal IDLED may be disabled after the delay time or at the same time. The first semiconductor apparatus 110 may transmit the command address signal CA including a preliminary command and the command address signal CA including a column command to the second semiconductor apparatus 120 so that the second semiconductor apparatus 120 may perform a write operation or a read operation. The first semiconductor apparatus 110 may transmit the clock synchronization command CAS in synchronization with the system clock signal HCK, and then transmit the write command WR or read command RD.

The command decoding circuit 123 may enable the clock synchronization signal ICAS based on the clock synchronization command CAS, and enable the write signal IWR or the read signal IRD based on the write command WR or the read command RD. The clock control circuit 122 may enable the synchronization completion signal WCKEN based on the clock synchronization signal ICAS. When a time corresponding to a write latency or a read latency elapses after the write command WR or the read command RD is transmitted, the clock control circuit 122 may disable the synchronization completion signal WCKEN.

When the idle signal IDLE is disabled, the first transistor 312 of the power gating control circuit 310 may be turned on. When the clock synchronization signal ICAS is enabled, the second transistor 313 of the power gating control circuit 310 may apply, to the common node CN2, the first voltage V1 applied through the first transistor 312, thereby enabling the power gating signal PGC to a high logic level. When the power gating signal PGC is enabled to a high logic level, the power gating circuit 320 may apply the first and second operating voltages VH and VL to the internal circuit 330. The internal circuit 330 may be activated by receiving the first and second operating voltages VH and VL and may perform a predetermined operation. Subsequently, the first semiconductor apparatus 110 may transmit the command address signal CA including the precharge command PRE to the second semiconductor apparatus 120. The command decoding circuit 123 may enable the idle signal IDLE based on the precharge command PRE. When the idle signal IDLE is enabled, the delayed idle signal IDLED may be generated after the delay time. The power gating control circuit 310 may disable the power gating signal PGC based on the delayed idle signal IDLED. When the power gating signal PGC is disabled, the power gating circuit 320 may not apply the first and second operating voltages VH and VL to the internal circuit 330 and the internal circuit 330 may be deactivated and may not consume power.

Since the power gating control circuit 310 enables the power gating signal PGC based on the clock synchronization signal ICAS, the power gating control circuit 210 illustrated in FIG. 2 may activate the internal circuit 330 earlier than the time point at which the internal circuit 230 is activated. Since the power gating control circuit 310 disables the power gating signal PGC based on the delayed idle signal IDLED, the power gating control circuit 210 illustrated in FIG. 2 may deactivate the internal circuit 330 more slowly than the time point at which the internal circuit 230 is deactivated. Accordingly, it is possible to sufficiently secure a margin between the time point at which the operation of the internal circuit 330 is required and the time point at which the internal circuit 330 is activated.

Figure 7:
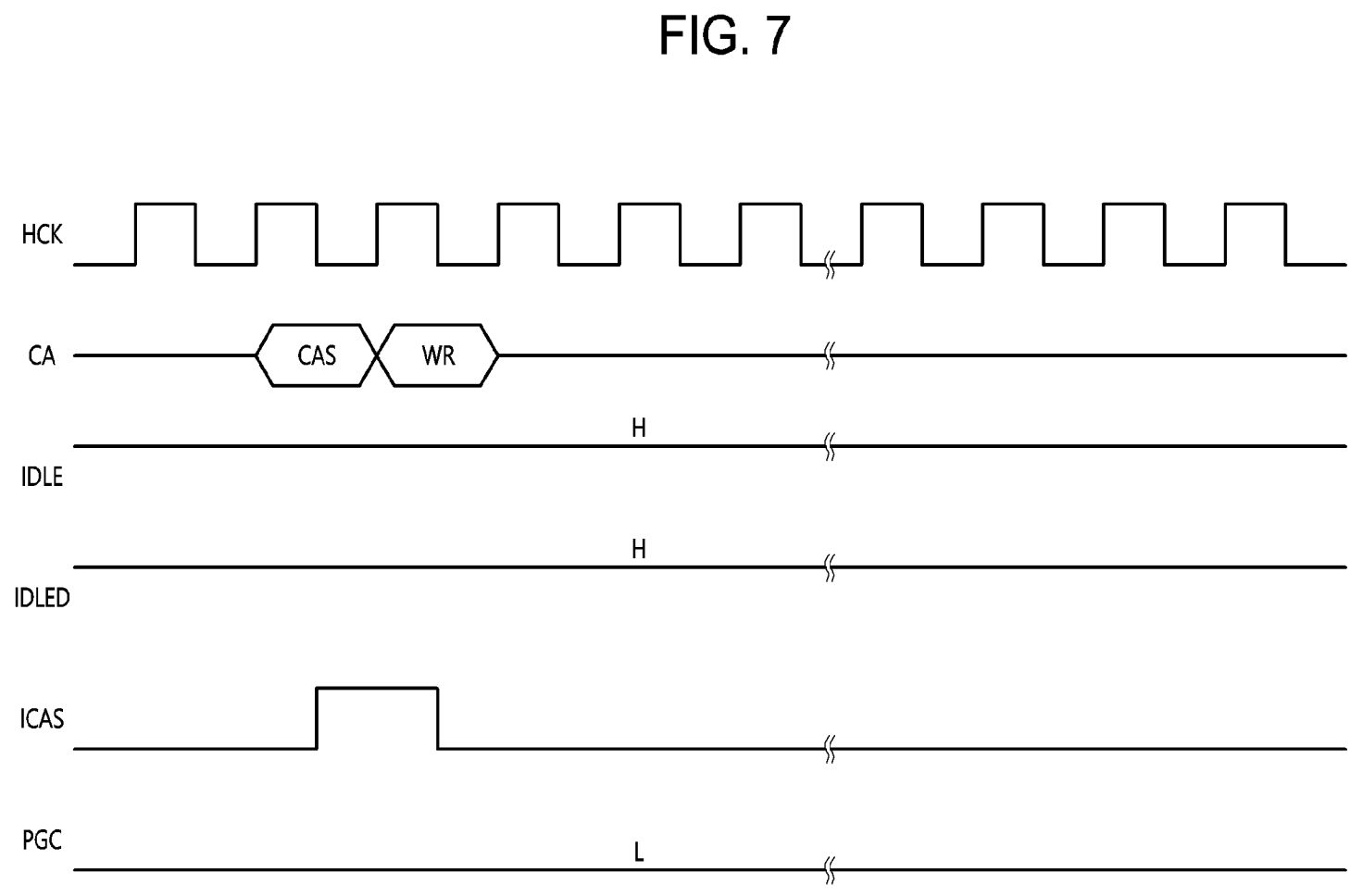

FIG. 7 is a timing diagram illustrating an operation of the semiconductor system 100 in accordance with an embodiment of the present disclosure. The first semiconductor apparatus 110 may transmit the clock synchronization command CAS and the write command WR or the read command RD in order to perform the training operation of the second semiconductor apparatus 120. Since the first semiconductor apparatus 110 does not provide the active command ACT to the second semiconductor apparatus 120, the idle signal IDLE and the delayed idle signal IDLED may remain enabled to a high logic level. Since the idle signal IDLE and the delayed idle signal IDLED are enabled even though the clock synchronization signal ICAS is enabled based on the clock synchronization command CAS, the power gating control circuit 310 may maintain the power gating signal PGC in a disabled state. The power gating circuit 320 may deactivate the internal circuit 330 without applying the first and second operating voltages VH and VL to the internal circuit 330 based on the power gating signal PGC. Accordingly, power may be prevented from being unnecessarily consumed in the second semiconductor apparatus 120.

Figure 8:
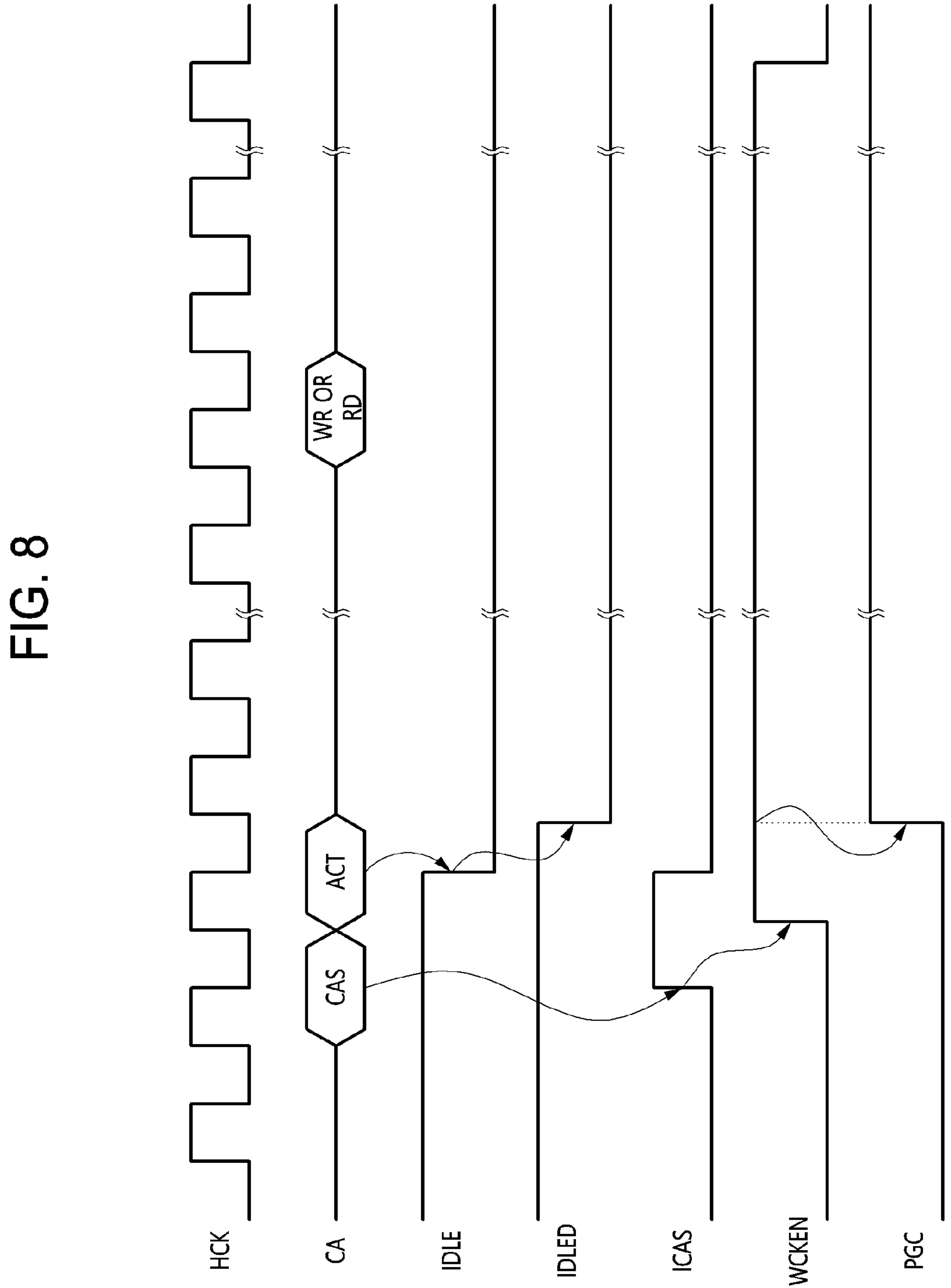
FIG. 8 is a timing diagram illustrating an operation of the semiconductor system in accordance with an embodiment.

FIG. 8 is a timing diagram illustrating an operation of the semiconductor system 100 in accordance with an embodiment of the present disclosure. Referring to FIG. 8, in order to quickly perform a clock synchronization operation of the second semiconductor apparatus 120 through the fast synchronization mode, the first semiconductor apparatus 110 may transmit a command address signal CA including the preliminary command together with a command address signal CA including the active command ACT. The first semiconductor apparatus 110 may transmit the clock synchronization command CAS and then transmit the active command ACT. The command decoding circuit 123 may enable the clock synchronization signal ICAS based on the clock synchronization command CAS. The clock control circuit 122 may synchronize the phases of the system clock signal HCK and the data clock signal WCK based on the clock synchronization signal ICAS, and enable the synchronization completion signal WCKEN. In such a case, since the idle signal IDLE remains enabled to a high logic level, the power gating control circuit 310 may maintain the power gating signal PGC in a disabled state. Subsequently, the command decoding circuit 123 may enable the internal active signal IACT based on the active command ACT, and disable the idle signal IDLE and the delayed idle signal IDLED. When the idle signal IDLE and the delayed idle signal IDLED are disabled, the clock synchronization signal ICAS may be disabled, but since the synchronization completion signal WCKEN remains enabled, the power gating control circuit 310 may enable the power gating signal PGC. Subsequently, the command address signal CA including the write command WR or the read command RD may be transmitted from the first semiconductor apparatus 110 to the second semiconductor apparatus 120. In an embodiment, when the active command ACT and the preliminary command are transmitted together, the first semiconductor apparatus 110 may not transmit the preliminary command to the second semiconductor apparatus 120 before transmitting the write command WR or the read command RD. When a time corresponding to a write latency or a read latency elapses after the write command WR or the read command RD is transmitted, the synchronization completion signal WCKEN may be disabled. In an embodiment, when the write command WR or the read command RD is received and then is additionally transmitted, the synchronization completion signal WCKEN may remain enabled until a time corresponding to the write latency or the read latency elapses after the additional write command WR or the additional read command RD is transmitted.

FIG. 9 is a diagram illustrating a partial configuration of a semiconductor apparatus 400 in accordance with an embodiment of the present disclosure. The semiconductor apparatus 400 may be applied as the second semiconductor apparatus 120 of FIG. 1.

Referring to FIG. 9, the semiconductor apparatus 400 may include a memory cell array 410, a global column control circuit 420, a data input/output circuit 430, and a global power gating circuit 440. The memory cell array 410 may be a component corresponding to the memory cell array 121 of FIG. 1. The memory cell array 410 may include a plurality of memory banks, and may include at least a first memory bank 411 and a second memory bank 412.

The global column control circuit 420 may be a component corresponding to a part of the column control circuit 127 of FIG. 1. The global column control circuit 420 may be connected between the plurality of memory banks and the data input/output circuit 430, and may perform a data input/output operation between the plurality of memory banks and the data input/output circuit 430. The data input/output circuit 430 may be a component corresponding to the data input/output circuit 125 of FIG. 1.

Referring to FIG. 1 and FIG. 9, the data input/output circuit 440 may be connected to an external device (that is, the first semiconductor apparatus 110) through the data bus 104, and may perform a data input/output operation together with the first semiconductor apparatus 110. The data input/output circuit 430 may include a serializer-deserializer (SerDes), i.e. a serial-to-parallel converter, which generates global data GD by parallelizing data DQ transmitted serially through the data bus 104. It may also generate data DQ by serializing the global data GD. The global data GD may correspond to the internal data DIN of FIG. 1, and a line through which the global data GD is transmitted may correspond to the global data bus 128.

During the write operation, the first semiconductor apparatus 110 may transmit the data DQ to the data input/output circuit 430 through the data bus 104, and the data input/output circuit 430 may generate the global data GD by buffering the data DQ and transmit the global data GD to the global column control circuit 420. The global column control circuit 420 may buffer the global data GD and transmit the buffered data to the first and second memory banks 411 and 412, thereby storing the buffered data in the first and second memory banks 411 and 412.

During the read operation, the global column control circuit 420 may generate the global data GD by buffering data read from the first and second memory banks 411 and 412, and transmit the global data GD to the data input/output circuit 430. The data input/output circuit 430 may generate the data DQ by buffering the global data GD, and transmit the data DQ to the first semiconductor apparatus 110 through the data bus 104.

The global power gating circuit 440 may receive a power gating signal PGC. The global power gating circuit 440 may receive at least a first operating voltage VH. The global power gating circuit 440 may selectively apply the first operating voltage VH to the global column control circuit 420 based on the power gating signal PGC. The semiconductor apparatus 400 may further include the power gating control circuit 310 illustrated in FIG. 5, and the power gating signal PGC may be generated from the power gating control circuit 310.

When the power gating signal PGC is enabled, the global power gating circuit 440 may apply the first operating voltage VH to the global column control circuit 420. When the power gating signal PGC is disabled, the global power gating circuit 440 may block the application of the first operating voltage VH or might not provide the first operating voltage VH to the global column control circuit 420. The global power gating circuit 440 may further receive a second operating voltage VL. The global power gating circuit 440 may selectively apply the second operating voltage VL to the global column control circuit 420 based on the power gating signal PGC. When the power gating signal PGC is enabled, the global power gating circuit 440 may apply the second operating voltage VL to the global column control circuit 420. When the power gating signal PGC is disabled, the global power gating circuit 440 may block the application of the second operating voltage VL to the global column control circuit 420.

The semiconductor apparatus 400 may further include a first local column control circuit 450, a second local column control circuit 460, a local power gating control circuit 470, a first local power gating circuit 480, and a second local power gating circuit 490. The first local column control circuit 450 may be a component corresponding to a part of the column control circuit 127. The first local column control circuit 450 may be connected between the first memory bank 411 and the global column control circuit 420. The first local column control circuit 450 may perform a data input/output operation between the first memory bank 411 and the global column control circuit 420.

During the write operation, the first local column control circuit 450 may receive first local data LD1 transmitted from the global column control circuit 420. The global column control circuit 420 may generate the first local data LD1 by buffering the global data GD. The first local column control circuit 450 may transmit the first local data LD1 to the first memory bank 411 to be stored in the first memory bank 411. During the read operation, the first local column control circuit 450 may generate the first local data LD1 by reading data stored in the first memory bank 411. The first local column control circuit 450 may transmit the first local data LD1 to the global column control circuit 420. The first local column control circuit 450 may be selectively activated by the first local power gating circuit 480.

The second local column control circuit 460 may be a component part of the column control circuit 127. The second local column control circuit 460 may be connected between the second memory bank 412 and the global column control circuit 420. The second local column control circuit 460 may perform a data input/output operation between the second memory bank 412 and the global column control circuit 420. During the write operation, the second local column control circuit 460 may receive second local data LD2 from the global column control circuit 420. The global column control circuit 420 may generate the second local data LD2 by buffering the global data GD. The second local column control circuit 460 may transmit the second local data LD2 to the second memory bank 412 to be stored in the second memory bank 412. During the read operation, the second local column control circuit 460 may generate the second local data LD2 by reading data stored in the second memory bank 412. The second local column control circuit 460 may transmit the second local data LD2 to the global column control circuit 420. The second local column control circuit 460 may be selectively activated by the second local power gating circuit 490.

The local power gating control circuit 470 may receive the power gating signal PGC and a bank select signal BACT. The local power gating control circuit 470 may generate a first local power gating signal LPGC1 and a second local power gating signal LPGC2 based on the power gating signal PGC and the bank select signal BACT. When the power gating signal PGC is disabled, the local power gating control circuit 470 may disable both the first and second local power gating signals LPGC1 and LPGC2. When the power gating signal PGC is enabled, the local power gating control circuit 470 may enable the first and second local power gating signals LPGC1 and LPGC2 based on the bank select signal BACT. The bank select signal BACT may be generated based on the bank address signal BA of FIG. 1. The address decoding circuit 124 may change a value of the bank select signal BACT according to a logic level of the bank address signal BA.

For example, when the bank select signal BACT includes information for selecting the first memory bank 411, the local power gating control circuit 470 may enable the first local power gating signal LPGC1, and maintain the second local power gating signal LPGC2 in a disabled state. When the bank select signal BACT includes information for selecting the second memory bank 412, the local power gating control circuit 470 may enable the second local power gating signal LPGC2, and maintain the first local power gating signal LPGC1 in a disabled state. The bank select signal BACT may include at least one bit. For example, the bank select signal BACT may have a first logic level in order to select the first memory bank 411 and a second logic level in order to select the second memory bank 412. In an embodiment, the semiconductor apparatus 400 may include four or more memory banks, and the bank select signal BACT may include 2 bits or more in order to include information for individually selecting the four or more memory banks.

The first local power gating circuit 480 may receive the first local power gating signal LPGC1 and the first operating voltage VH. The first local power gating circuit 480 may apply the first operating voltage VH to the first local column control circuit 450 based on the first local power gating signal LPGC1. When the first local power gating signal LPGC1 is enabled, the first local power gating circuit 480 may apply the first operating voltage VH to the first local column control circuit 450, thereby activating the first local column control circuit 450. When the first local power gating signal LPGC1 is disabled, the first local power gating circuit 480 may block the application of the first operating voltage VH to the first local column control circuit 450, thereby deactivating the first local column control circuit 450. The first local power gating circuit 480 may further receive the second operating voltage VL. The first local power gating circuit 480 may apply the second operating voltage VL to the first local column control circuit 450 based on the first local power gating signal LPGC1. When the first local power gating signal LPGC1 is enabled, the first local power gating circuit 480 may apply the second operating voltage VL to the first local column control circuit 450. When the first local power gating signal LPGC1 is disabled, the first local power gating circuit 480 may block the application of the second operating voltage VL to the first local column control circuit 450.

The second local power gating circuit 490 may receive the second local power gating signal LPGC2 and the first operating voltage VH. The second local power gating circuit 490 may apply the first operating voltage VH to the second local column control circuit 460 based on the second local power gating signal LPGC2. When the second local power gating signal LPGC2 is enabled, the second local power gating circuit 490 may apply the first operating voltage VH to the second local column control circuit 460, thereby activating the second local column control circuit 460. When the second local power gating signal LPGC2 is disabled, the second local power gating circuit 490 may block the application of the first operating voltage VH to the second local column control circuit 460, thereby deactivating the second local column control circuit 460. The second local power gating circuit 490 may further receive the second operating voltage VL. The second local power gating circuit 490 may apply the second operating voltage VL to the second local column control circuit 460 based on the second local power gating signal LPGC2. When the second local power gating signal LPGC2 is enabled, the second local power gating circuit 490 may apply the second operating voltage VL to the second local column control circuit 460. When the second local power gating signal LPGC2 is disabled, the second local power gating circuit 490 may block the application of the second operating voltage VL to the second local column control circuit 460.

A person of ordinary skill in the art to which the present disclosure pertains will recognize and understand that the disclosed embodiments may be revised without departing from the true scope of the invention, which is set out in the appurtenant claims. It should be understood that the embodiments described above are illustrative and not limiting.

The true scope of the present disclosure is defined by the claims rather than the disclosed embodiments.

What is claimed is:

1. A semiconductor apparatus comprising:

a power gating control circuit configured to change a voltage level of a common node based on a clock synchronization signal and an idle signal, configured to latch the voltage level of the common node to generate a power gating signal, and configured to prevent the power gating signal from being enabled when the idle signal is enabled; and a power gating circuit configured to apply a first operating voltage to an internal circuit of the semiconductor apparatus responsive the power gating signal.

2. The semiconductor apparatus according to claim 1, wherein the semiconductor apparatus is configured to receive a first clock signal and a second clock signal; and wherein the clock synchronization signal is generated from a preliminary command, which causes the second clock signal to be synchronized with the first clock signal.

3. The semiconductor apparatus according to claim 2, wherein, after the preliminary command is received, the gating control circuit receives at least one of an active command, a write command, and a read command.

4. The semiconductor apparatus according to claim 1, wherein the semiconductor apparatus is configured to generate an idle signal is generated based on an active command and a precharge command.

5. The semiconductor apparatus according to claim 1, wherein, when the idle signal is disabled and the clock synchronization signal is enabled, the power gating control circuit enables the power gating signal, and when the idle signal is enabled, the power gating control circuit disables the power gating signal.

6. The semiconductor apparatus according to claim 5, wherein the power gating control circuit is additionally configured to receive a synchronization completion signal generated based on the clock synchronization signal, and when the idle signal is disabled and at least one of the clock synchronization signal and the synchronization completion signal is enabled, the power gating control circuit is configured to enable the power gating signal.

7. The semiconductor apparatus according to claim 1, wherein the power gating control circuit is further configured to provide a second operating voltage to the internal circuit of the semiconductor device, based on the power gating signal.

8. The semiconductor apparatus according to claim 1, wherein the power gating control circuit includes a latch driver configured to latch the voltage level of the common node to generate the power gating signal.

* * * * *